United States Patent
Horng et al.

(10) Patent No.: US 8,853,055 B2
(45) Date of Patent: Oct. 7, 2014

(54) METHOD FOR MANUFACTURING SEMICONDUCTOR DEVICE, EPITAXIAL SUBSTRATE FOR USE THEREIN AND SEMI-FINISHED SEMICONDUCTOR DEVICE

(71) Applicant: National Chung-Hsing University, Taichung (TW)

(72) Inventors: Ray-Hua Horng, Taichung (TW); Ming-Chun Tseng, Kaohsiung (TW); Fan-Lei Wu, Taichung (TW)

(73) Assignee: National Chung-Hsing University, Taichung (TW)

( * ) Notice: Subject to any disclaimer, the term of this patent is extended or adjusted under 35 U.S.C. 154(b) by 0 days.

(21) Appl. No.: 13/846,298

(22) Filed: Mar. 18, 2013

(65) Prior Publication Data
US 2013/0313686 A1    Nov. 28, 2013

(30) Foreign Application Priority Data
May 22, 2012  (TW) .............................. 101118165 A (51) Int. Cl.
  *H01L 21/30*    (2006.01)
  *H01L 21/46*    (2006.01)
  *H01L 21/762*   (2006.01)
  *H01L 29/06*    (2006.01)
  *H01L 21/78*    (2006.01)

(52) U.S. Cl.
  CPC .......... *H01L 21/76254* (2013.01); *H01L 29/06* (2013.01); *H01L 21/76251* (2013.01); *H01L 21/7813* (2013.01)
  USPC .......................................... 438/455; 438/406

(58) Field of Classification Search
  CPC .................... H01L 21/76254; H01L 21/76251
  USPC .................................................. 438/406, 455
  See application file for complete search history.

(56) References Cited

U.S. PATENT DOCUMENTS

2008/0248251 A1 * 10/2008 Ghyselen et al. ............. 428/156
2012/0228613 A1 *  9/2012 Seki et al. ..................... 257/52

\* cited by examiner

*Primary Examiner* — Phat X Cao
(74) *Attorney, Agent, or Firm* — Foley & Lardner LLP (57) ABSTRACT

A method for manufacturing a semiconductor device includes: (a) providing a base unit made of a material having a first lattice constant; (b) forming a first sacrificial layer made of a material having a second lattice constant on the base unit and a second sacrificial layer made of a material having a third lattice constant on the first sacrificial layer, the first lattice constant ranging between the second and third lattice constants so that two lattice stresses in opposite directions occur in the epitaxial substrate; (c) forming an epitaxial unit on the second sacrificial layer; (d) forming a permanent substrate on the epitaxial unit; and (e) removing the epitaxial unit.

10 Claims, 6 Drawing Sheets

FIG. 1

PRIOR ART

FIG. 2

PRIOR ART

FIG. 3

PRIOR ART

METHOD FOR MANUFACTURING SEMICONDUCTOR DEVICE, EPITAXIAL SUBSTRATE FOR USE THEREIN AND SEMI-FINISHED SEMICONDUCTOR DEVICE

CROSS-REFERENCE TO RELATED APPLICATION

This application claims priority of Taiwanese Application No. 101118165, filed on May 22, 2012.

BACKGROUND OF THE INVENTION

1. Field of the Invention

The invention relates to a method for manufacturing a semiconductor device, more particularly to a method for manufacturing a semiconductor device using an epitaxy growth method, an epitaxial substrate for use in the method, and a semi-finished semiconductor device.

2. Description of the Related Art

Generally, in the fabrication of a semiconductor device using the epitaxy growth method, an epitaxial substrate is needed to permit growth of an epitaxial layer thereon, and the epitaxial substrate is selected to have a lattice constant substantially matching the lattice constant of the epitaxial layer. However, some of the substrate cannot offer good thermal conductivity. For example, in a III-V groups solar cell, epitaxial elements which are epitaxially grown on an epitaxial substrate are primary made from gallium arsenide (GaAs), aluminum gallium arsenide (AlGaAs), gallium indium phophide (GaInP), aluminum gallium indium phosphide (AlGaInP), and GaAs related materials, and thus a lattice matching material for the epitaxial substrate is preferably gallium arsenide (GaAs). However, since the GaAs substrate has a low thermal conductivity, the resulting solar cell is likely to suffer from high working temperature, low efficiency, and short service life due to heat generated during operation and sun light irradiation, etc. On the other hand, if a material with high thermal conductivity is selected, the same has lattice mismatching problem with the epitaxial material for the epitaxial elements, which leads to a large amount of defects in the epitaxial structure, thereby lowering the quality of the epitaxial structure.

To solve the aforementioned problems, it has been proposed to use a substrate made of a material having a lattice constant matching that of the epitaxial layer. The substrate is then removed after growth of an epitaxial structure, and the grown epitaxial structure is transferred to another substrate with a higher thermal conductivity. In this manner, the thermal conductivity of the resulting semiconductor device is raised and the removed substrate can be recycled after a proper cleaning process so as to reduce overall manufacturing costs.

Figure 1:
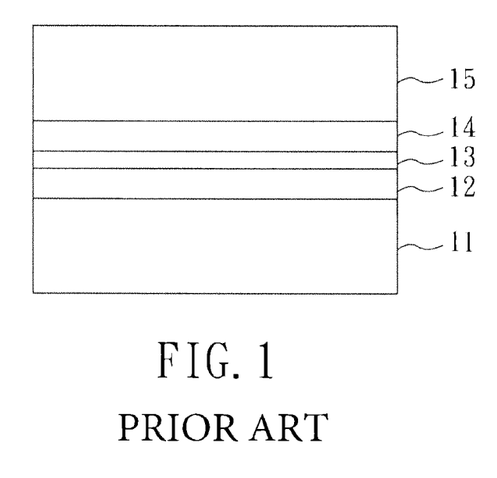
FIG. 1 is a schematic diagram illustrating a semi-finished semiconductor device in a conventional method, the semi-finished semiconductor device including a gallium arsenide substrate and a thermal conductive substrate.
Figure 2:
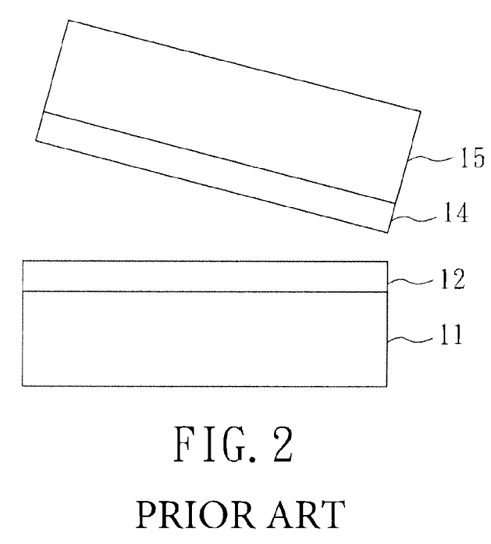
FIG. 2 is a schematic diagram illustrating removal of a sacrificial layer in the conventional method for separation of an epitaxial structure from the gallium arsenide substrate.

Referring to FIGS. 1 and 2, there is shown a conventional method for making a semiconductor device, in which a substrate transferring step is involved. As shown, a buffer layer 12 is formed on a gallium arsenide substrate 11. Then, a sacrificial layer 13 having a lattice constant matching that of a semiconductor epitaxial material to be grown and a high etching selectivity is then formed on the buffer layer 12. Thereafter, an epitaxial structure 14 of the semiconductor epitaxial material is epitaxially grown on the sacrificial layer 13. Subsequently, a thermal conductive substrate 15 is attached to a surface of the epitaxial structure 14 remote from the gallium arsenide substrate 11. Finally, the sacrificial layer 13 is destroyed by wet etching to enable separation of the epitaxial structure 14 from the gallium arsenide substrate 11, thereby producing a semiconductor device with the thermal conductive substrate 15.

Because the sacrificial layer 13 is removed by wet etching using a chemical etchant, the overall thickness thereof is preferably not too thin. Otherwise, the etching rate would be relatively slow to undesirably prolong the time period of the manufacturing process. Moreover, the epitaxial structure 14 might be damaged after long-term immersion in the chemical etchant. On the other hand, if the thickness of the sacrificial layer 13 is increased in order to shorten the time period required for etching, stress between the sacrificial layer 13 and a surface of the epitaxial structure 14 would be increased, thereby resulting in more lattice defects in the epitaxial structure 14. Furthermore, the large thickness and stress may cause stress relaxation, which may lead to a great amount of dislocation defects in the epitaxial structure 14 and higher surface roughness, thereby reducing the efficiency of the semiconductor device.

In addition, the sacrificial layer 13 can only be etched from lateral sides using the chemical etchant. The etching rate is very low.

Figure 3:
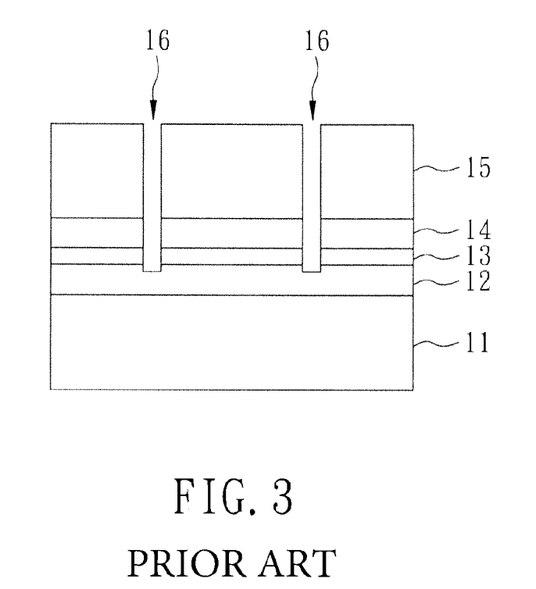
FIG. 3 is a schematic diagram illustrating another conventional method for manufacturing a semiconductor device in which etching holes are initially formed.

Referring to FIG. 3, in order to raise the rate of removal of the sacrificial layer 13, there is proposed another method for manufacturing a semiconductor device, wherein etching holes 16 which extend downwardly from the epitaxial structure 14 through the sacrificial layer 13 and the buffer layer 12 are initially formed to enable the chemical etchant to enter the etching holes 16 and reach the sacrificial layer 13 so that the contact surface between the chemical etchant and the sacrificial layer 13 is increased to raise the rate of removal of the sacrificial layer 13. This method, however, provides limited enhancement in the rate of removing the sacrificial layer 13.

SUMMARY OF THE INVENTION

Therefore, the object of the present invention is to provide a method for manufacturing a semiconductor device with an enhanced manufacturing efficiency and producing a high quality epitaxial structure.

Another object of the present invention is to provide an epitaxial substrate that enhances the manufacturing efficiency and that results in a high quality epitaxial structure.

Yet another object of the present invention is to provide a semi-finished semiconductor device that is produced with an enhanced manufacturing efficiency and that has a high quality epitaxial structure.

According to a first aspect of the present invention, a method for manufacturing a semiconductor device comprises: (a) providing a base unit made of a material having a first lattice constant; (b) forming a first sacrificial layer made of a material having a second lattice constant on the base unit and forming a second sacrificial layer made of a material having a third lattice constant on the first sacrificial layer, the first and second sacrificial layers cooperatively defining a sacrificial unit, the base unit and the sacrificial unit cooperatively defining an epitaxial substrate, the first lattice constant ranging between the second and third lattice constants so that two lattice stresses in opposite directions occur in the epitaxial substrate; (c) forming an epitaxial unit of a semiconductor material on the second sacrificial layer opposite to the base unit; (d) forming a permanent substrate on the epitaxial unit; and (e) removing the epitaxial unit from the epitaxial substrate by etching the sacrificial unit so as to obtain a semiconductor device containing the permanent substrate and the epitaxial unit.

According to a second aspect of the present invention, an epitaxial substrate comprises: a base unit made of a material having a first lattice constant; and a sacrificial unit containing a first sacrificial layer that is formed on the base unit and that is made of a material having a second lattice constant, and a second sacrificial layer that is formed on the first sacrificial layer and that is made of a material having a third lattice constant. The first lattice constant ranges between the second and third lattice constants so that two lattice stresses in opposite directions occur in the epitaxial substrate.

According to a third aspect of the present invention, a semi-finished semiconductor device comprises an epitaxial substrate and an epitaxial unit. The epitaxial substrate includes a base unit made of a material having a first lattice constant and a sacrificial unit which contains a first sacrificial layer that is formed on the base unit and that is made of a material having a second lattice constant, and a second sacrificial layer that is formed on the first sacrificial layer and that is made of a material having a third lattice constant. The first lattice constant ranges between the second and third lattice constants so that two lattice stresses in opposite directions occur in the epitaxial substrate. The epitaxial unit is made of a semiconductor material and is formed on the second sacrificial layer opposite to the base unit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail with reference to the accompanying preferred embodiments, it should be noted herein that like elements are denoted by the same reference numerals throughout the disclosure.

Figure 4:
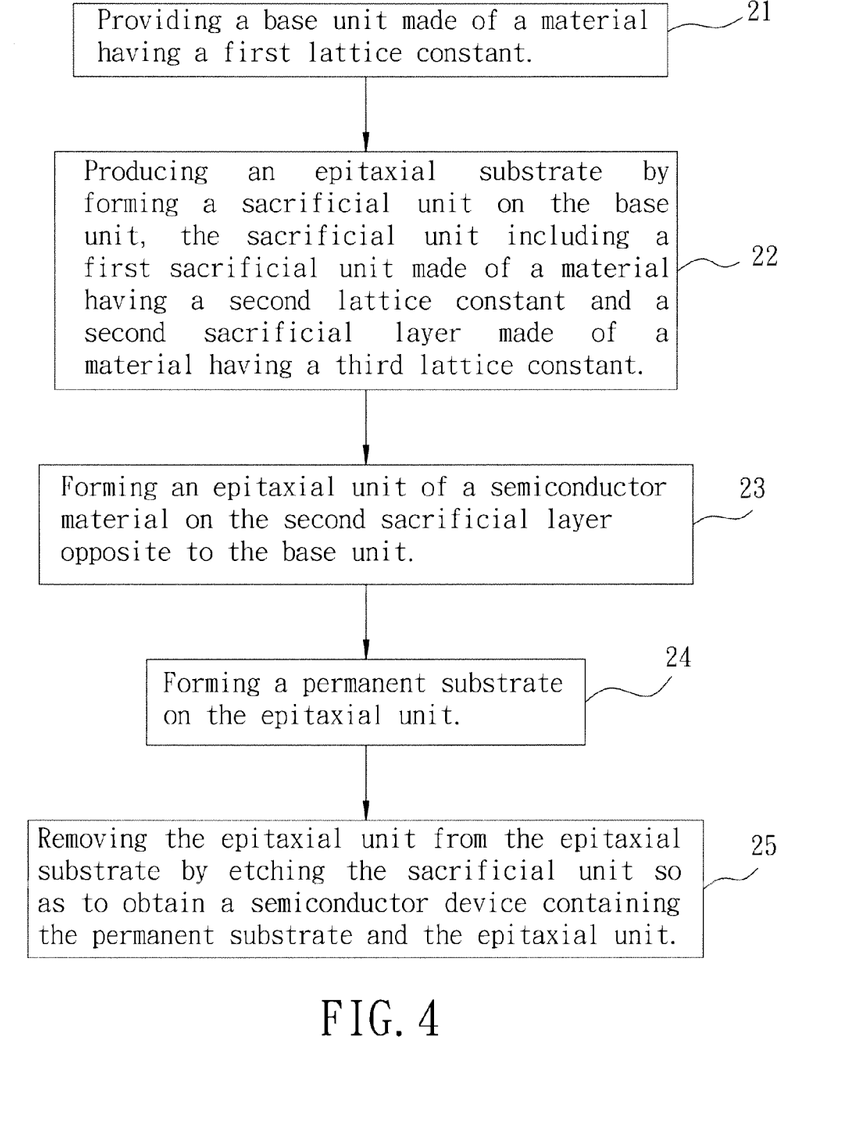
FIG. 4 is a flow chart illustrating the first preferred embodiment of a method for manufacturing a semiconductor device according to the present invention.
Figure 5:
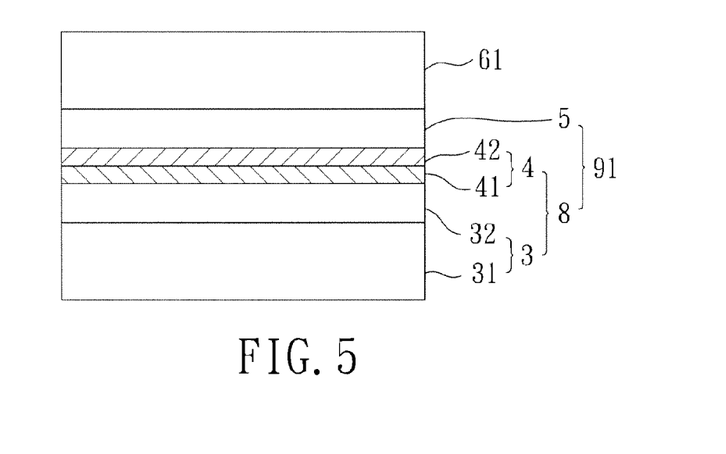
FIG. 5 is a schematic cross-sectional diagram illustrating a semi-finished semiconductor device in the first preferred embodiment.

FIGS. 4 and 5 show the first preferred embodiment of a method for manufacturing a semiconductor device, particularly a III-V group semiconductor device for use in a solar cell which is capable of a high energy conversion and thus requires a better heat dissipation effect.

Referring to FIGS. 4 and 5, in step 21, a material having a first lattice constant is selected for use as a base unit 3. Specifically, gallium arsenide (GaAs) is selected for use as a substrate layer 31. Then, a buffer layer 32 made of a material which is the same as the substrate layer 31 or which has a lattice constant substantially the same as that of the substrate layer 31 is grown on the substrate layer 31. Therefore, the base unit 3 is obtained. The buffer layer 32 protects a surface of the substrate layer 31 during the etching treatment and thus maintains integrity of the surface of the substrate 31 after a subsequent cleaning step in order to permit re-use of the substrate layer 31.

Subsequently, in step 22, materials respectively having second and third lattice constants are deposited on the base unit 3 to form a sacrificial unit 4, thereby obtaining an epitaxial substrate 8.

In the first preferred embodiment, the sacrificial unit 4 is composed of a first sacrificial layer 41 that is made of aluminum arsenide (AlAs) having the second lattice constant and that is formed on the base unit 3, and a second sacrificial layer 42 that is made of aluminum indium phosphide (AlInP) having the third lattice constant and that is formed on the first sacrificial layer 41. The first lattice constant of the base unit 3 made of gallium arsenide (GaAS) ranges between the second lattice constant of the first sacrificial layer 41 made of aluminum arsenide (AlAs) and the third lattice constant of the second sacrificial layer 42 made of aluminum indium phosphide (AlInP). Preferably, the first lattice constant is smaller than the second lattice constant and is larger than the third lattice constant.

Due to the difference in lattice constants of different layers, a compressive stress occurs at an interface between the first sacrificial layer 41 with a larger lattice constant and the base unit 3 with a smaller lattice constant. On the other hand, a tensile stress occurs between the second sacrificial layer 42 and the first sacrificial layer 41.

The absolute value ($\Delta$: unit is %) of the lattice mismatch can be calculated from the lattice constant ($=a_0$) of the underlying layer and the lattice constant ($=a$) of the deposited layer on the underlying layer according to the following formula:

$$\Delta(\%)=|(a-a_0)/a_0|\times 100$$

The thicknesses of the first and second sacrificial layers 41, 42 are controlled such that the absolute value of the lattice mismatch is smaller than 1%. Preferably, the thicknesses of the first and second sacrificial layers 41, 42 are controlled such that the absolute values of the two lattice stresses in opposite directions are substantially equal. As a result, the overall lattice stress on a top surface of the epitaxial substrate 8, that is a surface for growing an epitaxial unit and that is most remote from the base unit 3, is substantially reduced to minimum, which permits growth of the epitaxial unit with little lattice defect to obtain the grown epitaxial unit with a better quality.

In order to reduce the defects between layers, the thicknesses of the first sacrificial layer 41 and the second sacrificial layer 42 are controlled so as not to exceed the critical thickness in order to form a super lattice structure. Preferably, the critical thickness of each of the first and second sacrificial layers 41, 42 is less than 500 nm. Therefore, the problems of excessive stress and severely loose arrangement of lattices will not occur between layers of different materials. Moreover, with the combination of the first and second sacrificial layers 41 and 42, the total thickness of the sacrificial unit 4 is enlarged, thereby facilitating subsequent removal thereof by etching.

Next, in step 23, an epitaxial unit 5 of a semiconductor material is epitaxially formed on the top surface of the sacrificial unit 4. Since the overall lattice stress on the top surface of the sacrificial unit 4 is substantially minimized, lattice defects are minimized during the epitaxial growth of the epitaxial unit 5, thereby producing a semi-finished semiconductor device 91 with good epitaxial structure.

In step 24, a permanent substrate 61 is formed on the epitaxial unit 5. The permanent substrate 61 is made primarily of a metal or an alloy with good thermal conductivity and heat-dissipating effect.

Finally, in step 25, the epitaxial unit 5 is removed from the epitaxial substrate 8 by etching the sacrificial unit 4 so as to obtain a semiconductor device which contains the permanent substrate 61 and the epitaxial unit 5 and which has a good heat-dissipating effect. The sacrificial unit 4 is removed by wet etching using a chemical etchant. By virtue of the contact between the sacrificial unit 4 and the chemical etchant, the sacrificial unit 4 is removed so as to cause the epitaxial unit 5, disposed on one side of the sacrificial unit 4, to be separated from the base unit 3, disposed on the opposite side of the sacrificial unit 4.

Notably, the chemical etchant includes a volatile organic solution, such as surfactants, ketones, alcohols, etc. The volatile organic solution imparts hydrophilic characteristics to the surface of the sacrificial layer 4 in contact with the chemical etchant. In the preferred embodiment, acetone or isopropanol is selected as the volatile organic solution. By imparting hydrophilic characteristics to the surface of the sacrificial layer 4 using the volatile organic solution, the lateral etching rate of the sacrificial unit 4 is thus raised, thereby shortening the time period required for the etching treatment and enhancing the manufacturing efficiency.

Figure 6:
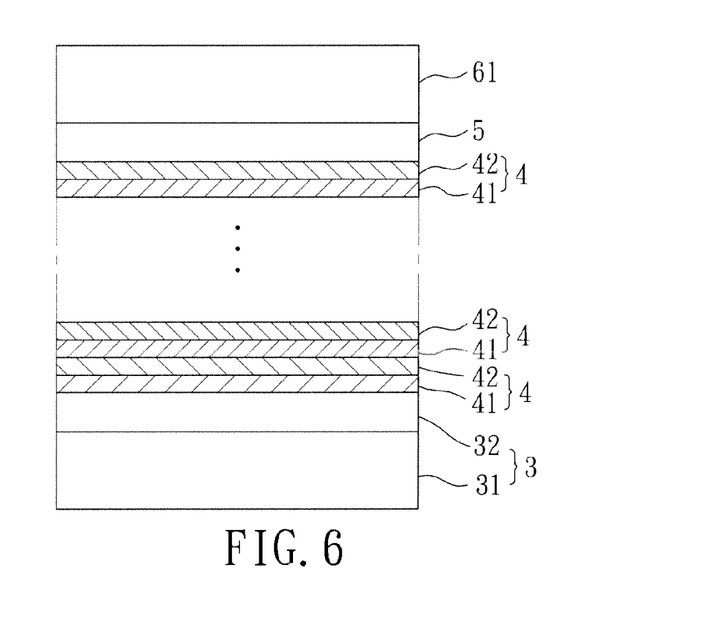
FIG. 6 is a schematic cross-sectional diagram illustrating a semi-finished semiconductor device made in the second preferred embodiment of a method for manufacturing a semiconductor device according to the present invention.

Referring to FIG. 6, in a second preferred embodiment, to increase etch rate of the sacrificial units 4, a plurality of the sacrificial units 4 are formed on top of the base unit 3. As shown, the first and second sacrificial layers 41, 42 are alternately arranged and superimposed one over another. Similarly, the thicknesses of the first and second sacrificial layers 41, 42 of the plurality of the sacrificial units 4 are controlled such that the absolute values of the two lattice stresses in opposite directions are substantially equal and the overall stress on the top surface of the uppermost one of the sacrificial units is substantially reduced to minimum to prevent adverse effect on the lattice quality of the subsequently grown epitaxial unit 5.

Figure 7:
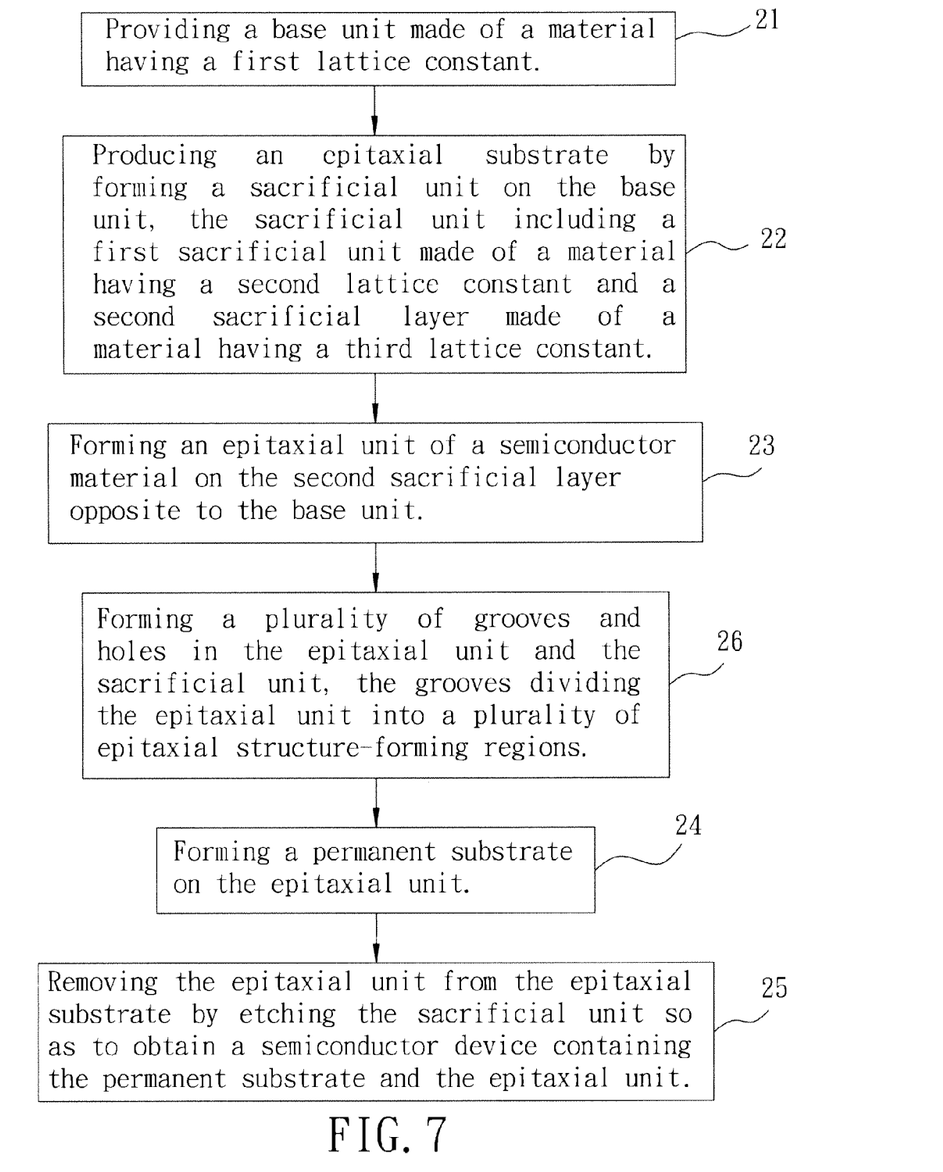
FIG. 7 is a flow chart illustrating the third preferred embodiment of a method for manufacturing a semiconductor device according to the present invention.
Figure 8:
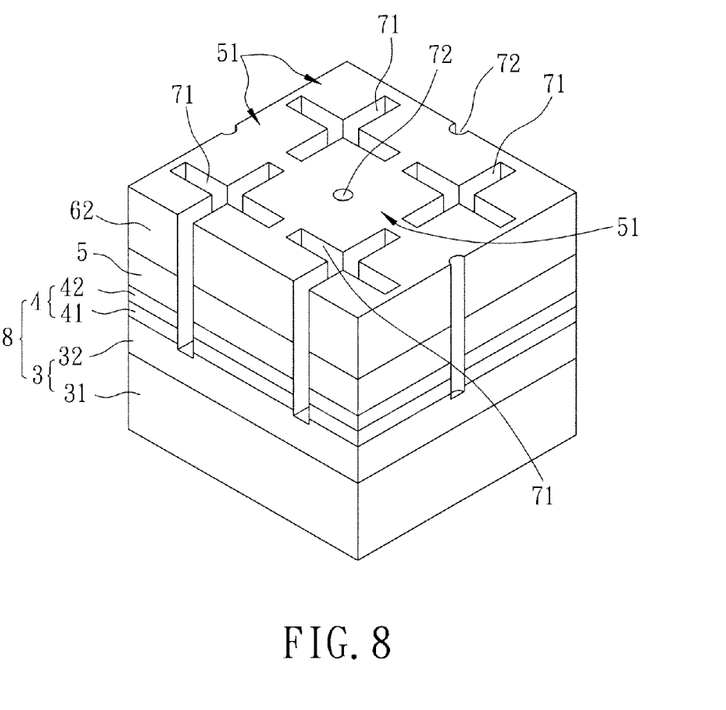
FIG. 8 is a schematic cross-sectional diagram illustrating a semi-finished semiconductor device in the third preferred embodiment.

Referring to FIGS. 7 and 8, in the third preferred embodiment of a method for manufacturing a semiconductor device according to the present invention, steps 21, 22, 23 are performed in the same manner as those in the first preferred embodiment. Thereafter, step 26 is performed for forming a plurality of grooves 71 in the epitaxial unit 5 and the sacrificial unit 4. The grooves 71 extend from the top surface of the epitaxial unit 5 toward the epitaxial substrate 8 and remove partial structures of the epitaxial unit 5 and the sacrificial unit 4. Each of the grooves 71 has a cross shape in cross section and the grooves 71 are arranged in arrays to divide the epitaxial unit 5 into a plurality of epitaxial structure-forming regions 51. In addition to the grooves 71, a plurality of holes 72 are formed simultaneously in the epitaxial unit 5 and the sacrificial unit 4. As shown, each of the holes 72 is disposed in a respective one of the epitaxial structure-forming regions 51.

The grooves 71 not only divide the epitaxial unit 5 into a plurality of epitaxial structure-forming regions 51 which are arranged in array, but also increase the contact surface between the sacrificial unit 4 and the chemical etchant. The holes 72 have a relatively small radius and do not affect subsequent operation of the epitaxial structures 51. The holes 72 further increase the contact surface between the sacrificial unit 4 and the chemical etchant to significantly reduce the time period required for etching.

Next, in step 24, a permanent substrate 62 is formed on top of the remaining part of the epitaxial unit 5 by deposition. In this embodiment, the grooves 71 and the holes 72 are initially filled with a photoresist material before deposition of the permanent substrate 62 such that the permanent substrate 62 will not be deposited in the grooves 71 and the holes 72 or cover the grooves 71 and the holes 72. The photoresist material is then removed after forming the permanent substrate 62, thereby exposing the grooves 71 and the holes 72.

In the last step 25, the sacrificial unit 4 is removed using a chemical etchant. With the provision of the grooves 71 and holes 72, the contact surface between the sacrificial unit 4 and the chemical etchant is significantly increased and the etching rate is thus raised.

Preferably, the chemical etchant used in this preferred embodiment may contain a volatile organic solution such as surfactants, ketones, alcohols, etc., to impart hydrophilic characteristics to the sacrificial unit 4 so as to increase the lateral etching rate of the sacrificial unit 4, thereby further reducing the time period required for etching and for the overall manufacturing process. In this embodiment, the volatile organic solution is acetone or isopropanol.

In the method of the present invention, materials with different lattice constants are used for forming the base unit 3 and the first and second sacrificial layers 41, 42, and thus stresses in opposite directions are balanced out so that the overall lattice stress on the top surface of the sacrificial unit 4 can be minimized and little impact of stress is applied to the epitaxial unit 5 during the growth of the epitaxial unit 5, thereby leading to a better epitaxial quality. Besides, in the sacrificial unit 4, the thickness of each of the first and second sacrificial layers 41, 42 does not exceed the critical thickness so as to form the supper lattice structure. However, the total thickness of the first and second sacrificial layers 41, 42 is much greater than the thickness of the sacrificial layer formed in the conventional process, thereby facilitating etching of the sacrificial unit 4 without increasing the lattice stress on the top surface of the epitaxial substrate 8. In other words, the contact surface between the sacrificial unit 4 and the chemical etchant is increased without adversely affecting the quality of the epitaxial unit 5 grown on the epitaxial substrate 8. The good quality of the epitaxial unit 5 can be maintained owing to the balance of lattice stresses in opposite directions that occur due to the different lattice constants of the different materials used for forming layers of the epitaxial substrate 8. Furthermore, in the third embodiment of the method of the present invention, by forming the grooves 71 and holes 72 in the epitaxial unit 5 and the sacrificial unit 4, the lateral etching rate can be further increased to facilitate removal of the epitaxial unit 5 from the epitaxial substrate 8.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A method for manufacturing a semiconductor device, comprising:

(a) providing a base unit made of a material having a first lattice constant;

(b) forming a first sacrificial layer made of a material having a second lattice constant on the base unit and forming a second sacrificial layer made of a material having a third lattice constant on the first sacrificial layer, the first and second sacrificial layers cooperatively defining a sacrificial unit, the base unit and the sacrificial unit cooperatively defining an epitaxial substrate, the first lattice constant ranging between said second and third lattice constants so that two lattice stresses in opposite directions occur in the epitaxial substrate;

(c) forming an epitaxial unit of a semiconductor material on the second sacrificial layer opposite to the base unit;

(d) forming a permanent substrate on the epitaxial unit; and (e) removing the epitaxial unit from the epitaxial substrate by etching the sacrificial unit so as to obtain a semiconductor device containing the permanent substrate and the epitaxial unit.

2. The method of claim 1, wherein the thicknesses of the first and second sacrificial layers are controlled such that the absolute value of the lattice mismatch is smaller than 1%.

3. The method of claim 2, further comprising, after step (c), a step (f) of forming a plurality of grooves in the epitaxial unit and the sacrificial unit to divide the epitaxial unit into a plurality of epitaxial structure-forming regions.

4. The method of claim 3, further comprising a step (g) of forming a plurality of holes in the epitaxial unit and the sacrificial unit, each of the holes being disposed in a respective one of the epitaxial structure-forming regions.

5. The method of claim 4, wherein steps (f) and (g) are conducted simultaneously.

6. The method of claim 1, wherein step (e) is conducted by wet etching using a chemical etchant that contains a volatile organic solution, the volatile organic solution imparting hydrophilic characteristics to the surface of the sacrificial unit in contact with the chemical etchant.

7. The method of claim 6, wherein the volatile organic solution is selected from the group consisting of alcohols, ketones, and surfactants.

8. The method of claim 7, wherein the volatile organic solution is selected from the group consisting of acetone and isopropanol.

9. A method for manufacturing a semiconductor device, comprising:

(a) providing a base unit made of a material having a first lattice constant;

(b) forming a first sacrificial layer made of a material having a second lattice constant on the base unit and forming a second sacrificial layer made of a material having a third lattice constant on the first sacrificial layer, the first and second sacrificial layers cooperatively defining a sacrificial unit, the base unit and the sacrificial unit cooperatively defining an epitaxial substrate, the first lattice constant ranging between said second and third lattice constants so that two lattice stresses in opposite directions occur in the epitaxial substrate.

10. The method of claim 9, further comprising:

(c) forming an epitaxial unit of a semiconductor material on the second sacrificial layer opposite to the base unit.

* * * * *